United States Patent
Harrison et al.

(10) Patent No.: US 7,362,609 B2
(45) Date of Patent: Apr. 22, 2008

(54) MEMORY CELL

(75) Inventors: Barry H. Harrison, Nathan (AU); Sima Dimitrijev, Nathan (AU)

(73) Assignee: Griffith University, Nathan Queensland (AU)

( * ) Notice: Subject to any disclaimer, the term of this patent is extended or adjusted under 35 U.S.C. 154(b) by 156 days.

(21) Appl. No.: 10/526,382

(22) PCT Filed: Sep. 12, 2003

(86) PCT No.: PCT/AU03/01186

§ 371 (c)(1),
(2), (4) Date: Mar. 3, 2005

(87) PCT Pub. No.: WO2004/025660

PCT Pub. Date: Mar. 25, 2004

(65) Prior Publication Data

US 2006/0007727 A1    Jan. 12, 2006

(30) Foreign Application Priority Data

Sep. 12, 2002    (AU) .............................. 2002951339
Feb. 28, 2003    (AU) .............................. 2003900911

(51) Int. Cl.
*G11C 11/36* (2006.01)

(52) U.S. Cl. .................. 365/175; 365/177; 365/185.18

(58) Field of Classification Search ................ 365/175, 365/177, 185.18, 185.28; 257/E29.129, 257/E21.422, E21.688; 438/257, 197, 201
See application file for complete search history.

(56) References Cited

U.S. PATENT DOCUMENTS

| | | | |
|---|---|---|---|
| 5,465,249 A | 11/1995 | Cooper, Jr. et al. | |
| 5,528,547 A | 6/1996 | Aritome et al. | |
| 5,880,491 A * | 3/1999 | Soref et al. ................. | 257/190 |
| 5,986,931 A | 11/1999 | Caywood | |
| 6,344,991 B1 * | 2/2002 | Mikami et al. ............. | 365/145 |
| 6,429,492 B1 * | 8/2002 | Rockett ....................... | 257/368 |
| 6,794,255 B1 * | 9/2004 | Forbes et al. ............... | 438/285 |
| 6,803,243 B2 * | 10/2004 | Slater et al. .................. | 438/20 |
| 6,939,756 B1 | 9/2005 | Chung et al. | |
| 6,965,123 B1 * | 11/2005 | Forbes et al. ................. | 257/77 |
| 6,972,436 B2 * | 12/2005 | Das et al. ..................... | 257/77 |
| 7,145,167 B1 * | 12/2006 | Chu ............................. | 257/19 |

* cited by examiner

*Primary Examiner*—David Lam
(74) *Attorney, Agent, or Firm*—Connolly Bove Lodge & Hutz, LLP

(57) ABSTRACT

A one-transistor (1T) NVRAM cell that utilizes silicon carbide (SiC) to provide both isolation of non equilibrium charge, and fast and non destructive charging/discharging. To enable sensing of controlled resistance (and many memory levels) rather than capacitance, the cell incorporates a memory transistor that can be implemented in either silicon or Sic. The 1T cell has diode isolation to enable implementation of the architectures used in the present flash memories, and in particular the NOR and the NAND arrays. The 1T cell with diode isolation is not limited to SiC diodes. The fabrication method includes the step of forming a nitrided silicon oxide gate on the Sic substrate and subsequently carrying out the ion implantation and then finishing the formation of a self aligned MOSFET.

18 Claims, 10 Drawing Sheets

MEMORY CELL

This invention relates to a nonvolatile memory cell and in particular to a silicon carbide based memory cell.

BACKGROUND TO THE INVENTION

Dynamic Random Access Memory devices in the present silicon based technology are volatile because periodic refresh of the stored information is necessary and the information is lost when the memory cells are no longer connected to a power supply.

Flash memory provides the complementary functions in modern electronic systems. Flash memory uses a floating gate which is charged or discharged through the surrounding insulating material to change the logic state. It is a read-only memory (ROM), because the information writing takes too long and is limited to a certain number of writing cycles, so it cannot be used for RAM applications. However, it provides a nonvolatile storage of the information, which is kept even when any power is disconnected from the memory cells. Flash memory is also dependent on processing and in practice there is a need to adjust for processing by having a micro processor on the same chip with built in corrections to compensate for these process fluctuations.

There have been attempts to form non volatile random access memory (NVRAM) devices—a memory cell with access characteristics of silicon RAMs and with retention times of silicon ROMs (flash memories)—and U.S. Pat. No. 6,373,095 is an example.

Another challenge in developing memory devices is to enable an increase in memory capacity, and one way of achieving this is to reduce the cell area ($8F^2$ in current DRAMs). F is the minimum feature (the minimum line width that can be achieved by a certain technology), and $8F^2$ shows that the structure of state-of-the-art memory cells is such that every cell takes an area of $8F^2$. This challenge has been outlined by S. Okhonin, M. Nagoga, J. M. Sallese and P Fazan (IEEE Electron Device letters Vol 23 No 2 February 2002). A limiting factor in down scaling the feature size in the case of one transistor one capacitor (1T1C) cell used in DRAMs is that memory capacitance is dependent on F. Flash provides higher memory capacities because it uses a smaller one transistor (1T) cell with the possibility of more than 2 logic levels per cell. Still, there is a limit to the down scaling of the feature size, set by the need to accelerate electrons to energies that are sufficient for injection into the floating gate. A further factor is set by the minimum thickness of the insulator, which is subject to fatigue as the insulator thickness is reduced.

Silicon Carbide is not widely used to produce semiconductor devices which are mostly fabricated in silicon. Silicon carbide has been proposed for use in transistor applications but not for memory devices in U.S. Pat. Nos. 5,831,288, 6,218,254, and 6,281,521.

U.S. Pat. No. 6,365,919 discloses a Silicon carbide junction field effect transistor (JFET).

U.S. Pat. No. 5,465,249 discloses two possible implementations of the 1T1C cell in silicon carbide to achieve a nonvolatile RAM (NVRAM) with fast writing and virtually unlimited number of writing cycles (dynamic NVRAM). The difference between the two implementations is in the type of the transistor: SiC bipolar junction transistor (BJT) in one case and SiC metal-oxide-semiconductor field-effect transistor (MOSFET) in the other case. In both cases, the capacitor is implemented as metal-oxide-semiconductor (MOS) capacitor on SiC. Being 1T1C cell, the memory is read by sensing capacitance.

U.S. Pat. No. 5,510,630 discloses a SiC based 1T1C cell with a specific structure for the MOSFET (an accumulation-type MOSFET) and a stacked polysilicon-dielectric-metal capacitor.

U.S. Pat. Nos. 5,801,401, 5,989,958 and 6,166,401 disclose a ROM device using a silicon carbide floating gate.

It is an object of this invention to provide a dynamic NVRAM that is capable of having a small feature size and avoids the disadvantages of flash memory. A further object is to provide a cell that can enable more aggressive down scaling and significant reductions in power dissipation. This of course will also increase the density of memory storage.

BRIEF DESCRIPTION OF THE INVENTION

To this end the present invention provides a one-transistor (1T) NVRAM cell that utilizes silicon carbide to provide both isolation of nonequilibrium charge, and fast and nondestructive charging/discharging. To enable sensing of controlled resistance (and many memory levels) rather than capacitance, the cell incorporates a memory transistor that can be implemented in either silicon or silicon carbide.

This invention is partly predicated on the realisation that a nitrided $SiO_2$—SiC interface results in long retention of nonequilibrium charge that makes it suitable for developing non volatile memory storage devices. The process of preparing the device is based on nitridation of the SiC—$SiO_2$ interface, either by a direct oxide growth or oxide annealing in either NO or $N_2O$ ambients.

One embodiment of the invention is a modification of the 1T flash cell (prior art). The floating gate of the 1T flash cell can be considered as the connection between two capacitor terminals—one capacitor being between the control gate and the floating gate, and the other capacitor being between the floating gate and the channel of the transistor. Then, this embodiment of this invention can simply be described as a replacement of the capacitor on the control-gate side by a SiC diode. The SiC diode can provide the charge retention achieved by the replaced capacitor because both bulk and surface charge generation/recombination are practically negligible in passivated SiC regions. Importantly, the SiC diode can also provide fast and nondestructive charge removal/deposition, avoiding the limitations imposed by the replaced capacitor. Designing the diode as a reference diode enables the use of both forward and reverse turn-on voltages for easier charging and discharging operations. This 1T cell with diode isolation enables straightforward implementation of the architectures used in the present flash memories, and in particular the NOR and the NAND arrays that are established as the industry standards for code and data storage.

Thus in another aspect this invention provides Dynamic Nonvolatile Random Access Memory comprising one-transistor cells in which silicon carbide device is substituted for the capacitor between the control gate and floating gate and information is read by sensing resistance between the source and drain terminals of the transistor. The silicon carbide device may be a diode preferably a reference-type diode or a controlled switch preferably a transistor.

The disclosure of the 1T cell with a diode isolation in this invention is not limited to SiC diodes. Although a SiC diode is necessary to maximize the retention times, the use of other materials can still enable significant advantages in terms of increase of memory capacity. The memory-capacity increase above the levels possible with the existing cells still enables unique applications even with the need to periodically refresh the information by electrically refreshing the memory cells as in conventional dynamic RAM.

In another embodiment of this invention there is provided a metal oxide semiconductor field effect transistor (MOSFET) implemented in silicon or silicon carbide with the bit lines (the MOSFET drains) crossing the word lines (the MOSFET gates) and the sources are in parallel with the word lines. This MOSFET acts as a single transistor (capacitor less) NVRAM cell. Preferably the writing operations are performed with grounded gates (zero gate-to-substrate voltage). In this embodiment, the memory array is accessed by nonleaky switches and it is the implementation of the nonleaky switches that relies on the low generation/recombination rates in a passivated SiC. A SiC MOSFET is a typical implementation of the nonleaky switch, although other SiC-based switches (diodes, BJTs, etc.) can also be used.

In either embodiment, the cells are read by sensing resistance. This has the consequence of enabling multiple levels with a consequential increase in memory capacity and removes problems in down scaling the cell size.

This structure has a feature size of 4 $F^2$. Another advantage is that the logic levels are implemented as at least two states of channel resistance due to the channel charge and that the difference in the resistance values of the two levels is not critically dependent on F. A further advantage is multi level logic which is bought about by different amounts of channel charge and thus multiple levels of resistance.

Compared to Flash memory lower voltages are required and the speed of charging and discharging is greater than with Flash. The memory cell of this invention has none of the disadvantages of Flash memory with the added benefit that the cell may have several (infinite) logic states if they are needed. Another advantage that this invention has over Flash memory is that in Flash memory charging and discharging is destructive and changes the material state whereas in this invention the passivated interface provides fast and nondestructive charge removal/deposition. In this invention the charging and discharging of the gates through the diode does not change the electrical properties of the material forming the diode and does not in any way stress the gate oxide. With the dynamic memory cell of this invention the number of writing cycles is sufficiently high and the speed of discharging/charging is sufficiently quick to allow for real time data processing. The passivation of the Sic-$SiO_2$ interface creates charge retention times sufficiently long to avoid the need for the memory cell of this invention to be electrically refreshed as is the case with conventional RAM. Charge retention times beyond 7 years are achievable with this invention. Passivation may be by Thermal $SiO_2$ passivation or preferably by nitriding the surface at high temperatures with NO or $N_2O$.

The method for fabricating SiC diodes includes etching of SiC epitaxial layers and the essential step of forming "mildly" nitrided SiC—$SiO_2$ interface to reduce the surface generation/recombination rate. The method for fabrication of SiC MOSFETs also includes the essential step of forming a "mildly" nitrided gate oxide and subsequently carrying out the ion implantation and then finishing the formation of the MOSFET. It is preferred to use self-aligned MOSFETs.

The fabrication method which results in a self aligned MOSFET with a metal gate provides performance improvements (better down scaling of F, reduced power consumption, and reduced leakage through the gate oxide). Self-aligned MOSFETs are routinely made in silicon (either with polysilicon or metal gates). The challenge in SiC is due to the need for high-temperature annealing to activate the doping of the drain and the source areas after creating them by ion implantation with the MOSFET gates as self-aligning masks. The ion implantation may be performed at room temperature, but this requires prohibitively high annealing temperatures (>1400° C.). An alternative method is to perform the ion-implantation at high temperatures (about 800° C.), in which case the post implant annealing temperature up to 1300° C. is sufficient. The challenge with this is to find a metal (or a metal-based structure) that will provide the necessary adhesion to the gate oxide and that will withstand the high-temperature ion implantation. A preferred metal is Molybdenum and this allows a Mo-gate process that satisfies the conditions for fabrication of self-aligned SiC MOSFETs by hot ion implantation. Other suitable materials are $P^+$ polysilicon, and platinum silicide. An essential feature of this preferred method is the use of a capping dielectric (deposited oxide, for example) to prevent sublimation of the Mo gate, as well as coating the capping dielectric by a thin metal film to avoid damaging charging effects during the ion implantation.

In another aspect the present invention provides dynamic NVRAM consisting of a 1T cell wherein the transistor is created with:
 (a) polysilicon body,
 (b) metal or heavily-doped polysilicon contacts acting as source and drain regions, and
 (c) SiC gate that is integrated with the anode or the cathode of the isolating diode.

Critical Material and Technological Considerations

Proper functioning of the memory cell of this invention is enabled by
 (1) low generation/recombination rate and
 (2) low leakage through the gate oxide.

The requirement for low generation/recombination rate is the reason why silicon cannot be used to achieve very long storage times. Many semiconductor materials with wide energy gaps can theoretically fulfill this requirement, at least as far as the bulk recombination rate is concerned. However, the difficulty lies in achieving a high quality interface between the semiconductor with wide energy gap and a dielectric, so that the surface recombination rate is sufficiently reduced. The native oxide of SiC is silicon-dioxide, the same dielectric as in the only industry-standard semiconductor-dielectric interface developed so far—the silicon-silicon dioxide interface. SiC is the only wide energy gap material that can provide a high-quality interface with its native dielectric, so the implementabon of nonleaky switches (either diodes or transistors) in this invention is practically limited to silicon carbide substrate. There are many SiC polytypes (3C, 4H, 6H, . . . ) and each of them would satisfy the essential requirements. The energy gap of 3C SiC is about 2.4 eV, which is a smaller value compared to the other common polytypes (about 3.0 eV for 6H and about 3.2 eV for 4H SiC). This means the generation/recombination rate will be the largest of all common polytypes. However, a good-quality 3C material with a good quality gate-dielectric interface can provide a low enough generation/recombination rate for the implementation of the nonvolatile RAMS . The attractiveness of 3C SiC is that it can be deposited on Si, enabling either SiC films integrated on Si wafers or large-diameter stand-alone SiC wafers, for example, by a process being developed by Hoya Advanced Semiconductor Technologies (HAST). The quality of the interface between SiC and the gate dielectric is essential for both requirements (low surface recombination/generation rate and low leakage through the gate dielectric). This invention provides a specific treatment of the interface between SiC and the gate dielectric as one means of achieving the required high-quality interface. This treatment results in "nitrided" interface, where nitrogen atoms remove and passivate interfacial defects. The interface nitridation can be achieved by either direct oxide growth or by annealing of pre-grown oxide in either NO or $N_2O$ ambients at high temperatures (>1000° C.).

Critical Cell and Architecture Considerations

The two dominant approaches in terms of cell design and memory architecture will be labeled by 1C1T and 1T.

The 1C1T approach is found in modern DRAMs on silicon. In this type of cell, the transistor is used as a switch to access the capacitor where charge is stored to memorize different logic levels. The transistor is set as a switch in on mode to allow reading the information/charge stored at the capacitor. Therefore, it is said that capacitance is sensed in this type of cell. Although there is one transistor only and the capacitor can be stacked on top of the transistor, the use of the transistor as a switch connecting the capacitor necessitates a contact to be made outside the transistor area. Therefore, the area of this cell is larger than the area occupied by a single transistor and is typically equal to $8F^2$. Accordingly, the cell will be labeled as 1C1T to distinguish it from the 1T cells that occupy area no larger than the area of a single transistor.

1C1T cells with the transistor implemented in silicon (as in modern DRAMs) are volatile, meaning that the stored charge has to be periodically refreshed. Charge can leak through the gate oxide of the MOSFET (if the gate oxide is too thin) and through the channel of the MOSFET (if the subthreshold or off current is too high). Both these leakage mechanisms can be minimized to insignificant levels in SiC. In the case of silicon, charge leakage appears also due to high generation/recombination rates. This leakage is set by the energy gap of the material used (silicon in modern DRAMs) and cannot be avoided by cell design. If the transistor in the 1C1T cell is implemented in SiC, the generation/recombination rate can be reduced to insignificant levels, converting the 1C1T cell into a nonvolatile RAM. This is disclosed in U.S. Pat. Nos. 5,465,249 and 5,510,630.

Although the implementation of 1C1T cell in SiC solves the problem of memory volatility, the limitations related to memory capacity remain: (1) reduction in the feature size F is limited by the practical limits on sensing small capacitance (the capacitance is being reduced proportionally with the cell area, given that the capacitance is proportional to $F^2$), and (2) the lateral contact between the transistor and the capacitor causes a large cell area (about $8F^2$). Accordingly, the concepts of 1C1T cell are not used in this innovation.

The approach disclosed in this invention relates to the concept of 1T cell, typically found in modern flash memories. The advantages of this approach are that (1) smaller cell areas are possible (close to $4F^2$), (2) downscaling of the feature size F is not limited by the sensing mechanism given that resistance of the MOSFET is being sensed, and (3) multiple logic levels are practically feasible.

All these advantages help to achieve higher memory capacities, as evidenced by the fact that higher memory capacities are achieved by modern flash than by modern DRAMs.

It should be clarified that the 1T cell in flash incorporates not one but two vertically integrated capacitors: MOS capacitor between the floating gate and the MOSFET channel and a capacitor between the floating gate and the control gate. There is only one vertically integrated capacitor in the 1C1T cell. However, this does not make any difference in terms of cell size (the critical factor is the laterally connected capacitor in the cell that we refer to as the 1C1T).

The two vertically integrated capacitors in flash provide a specific way of achieving floating gate in electrical terms. We can refer to this type of floating gate as capacitor-isolated gate. An essential advantage of having a floating gate is that any nonequilibrium charge trapped in the floating gate can be maintained for a very long period of time. Therefore, this type of 1T cell becomes the elementary block for building nonvolatile memories. An inherent disadvantage of the capacitor-isolated gate emerges from the fact that the charge has to be forced to pass through the capacitor dielectric(s) in the processes of both charge deposition to and charge removal from the floating gate. The consequences are:

(1) the number of charging/discharging cycles is limited, (2) charging and discharging times are relatively long, (3) charging/discharging mechanisms impose limitations to downscaling of the feature size (F).

The first two factors limit the applications of this type of memory to what is known as read-only memory, and the third factor limits the increase in memory capacity.

The present invention provides 1T memory cells without the need for capacitor isolation, therefore, removing the disadvantages associated with flash memories. It further provides SiC with passivated surfaces which enables 1T nonvolatile-memory cells with fast writing of unlimited number of cycles. A number of specific implementations are possible, in particular a 1T cell with diode isolation and a 1T cell without gate isolation.

DETAILED DESCRIPTION OF THE INVENTION

Preferred embodiments of the invention will be described with reference to the drawings in which:

FIG. 1*a-c* shows relevant prior art: energy-band diagrams of 1T cell with capacitor-isolated floating gate used in flash memories;

FIG. 2*a-c* shows energy-band diagrams of 1T cell with diode isolation disclosed in this invention;

1T CELL WITH DIODE ISOLATION

This type of cell is the preferred embodiment of the invention. The difference from the capacitor-isolated 1T cell used in modern flash memories can simply be described as follows: the capacitor between the floating gate and the control gate is replaced by a SiC diode.

Figure 1A:
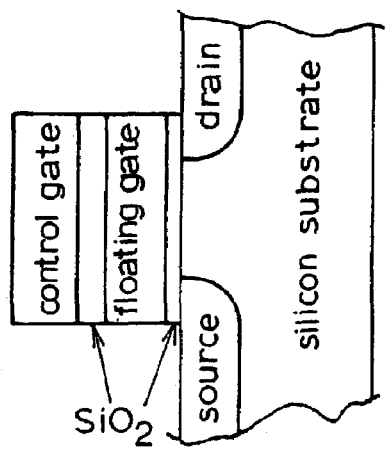
Figure 1B:
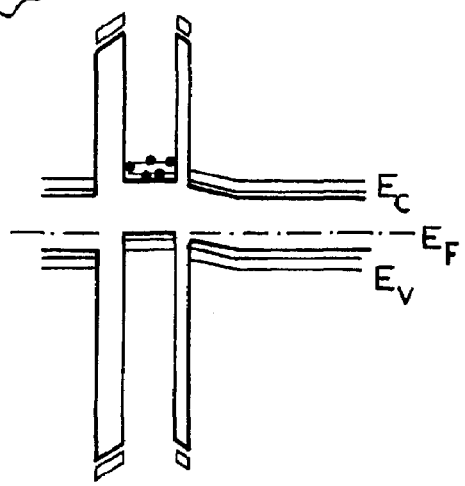
Figure 1C:
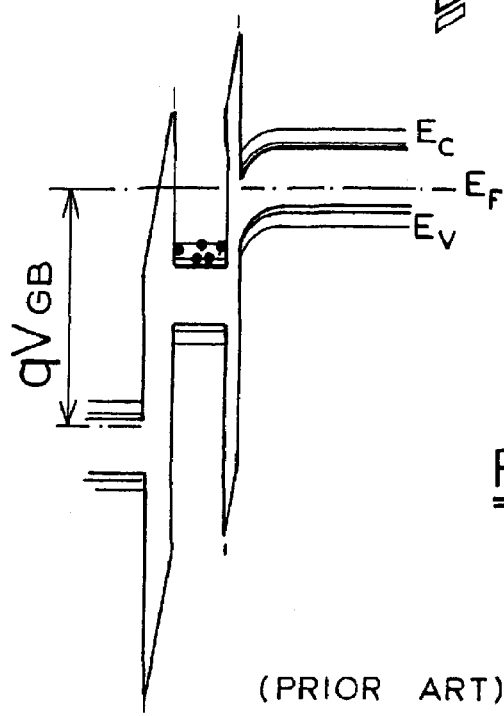

FIG. 1 shows the cross section and energy-band diagrams of a capacitor-isolated 1T cell. The case of zero voltage between the control gate and the body of the MOSFET (FIG. 1b) shows that the electrons are trapped in the potential well created by the floating gate and the surrounding gate dielectric. This enables the long charge-retention times, as even nonequilibrium charge cannot escape over the high potential barriers created by the dielectric of the capacitors on both sides. The case of positive voltage applied to the control gate (FIG. 1c) shows that the barrier height between the floating gate and the dielectric of either capacitor does not change. This causes the problem in terms of charge removal/deposition.

Figure 2A:
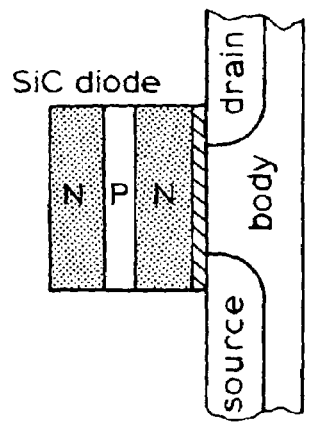
Figure 2B:
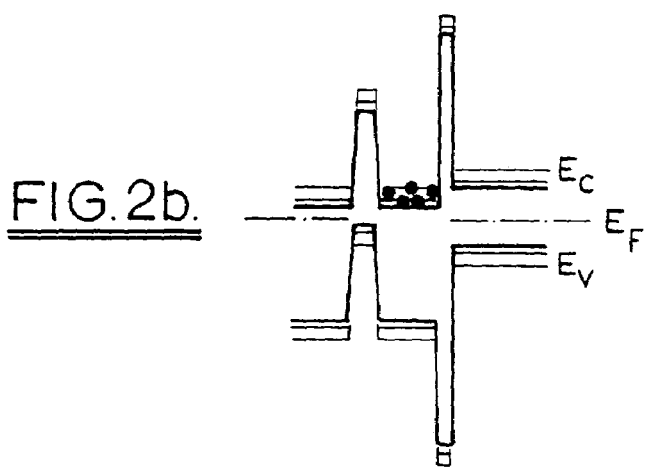
Figure 2C:
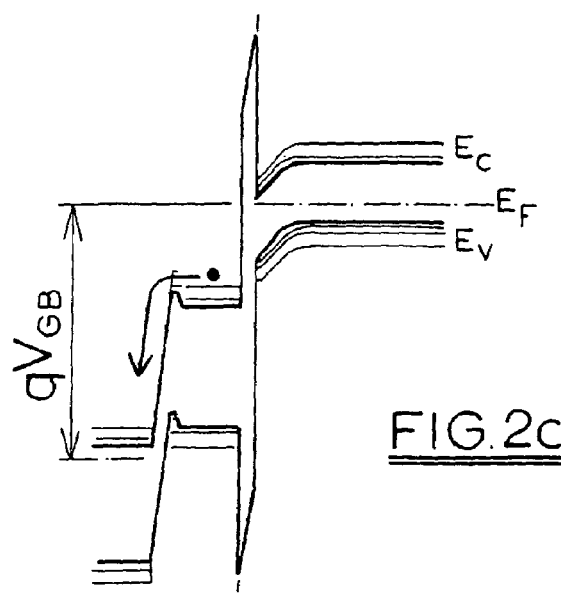

FIG. 2 shows the cross section and energy-band diagrams for a 1T cell with diode isolation. In this example, the diode is implemented as an NPN structure in SiC, separated by gate dielectric from the body of the MOSFET which can be created from silicon, polysilicon, or any other semiconductor. The case of zero bias (FIG. 2b) shows that the PN junction adjacent to the gate dielectric (the diode) creates a potential well that can store charge in a similar fashion as the potential well created by the floating gate (FIG. 1b). In principle, an NPN structure in silicon and any other semiconductor has the same energy-band diagram. The difference with the case of SiC is that a nonequilibrium charge can be retained in the potential well because all leakage paths are eliminated: (1) carrier generation in the depletion layer of the P—N junction is negligible because of the wide energy gap, (2) emission over the barrier is negligible because of the large barrier height (>1.5 eV), and (3) generation/recombination at the interface between SiC and the surrounding dielectric ($SiO_2$) is negligible. This enables long charge-retention times, just as in the case of the capacitor-isolated 1T cell.

The case of positive voltage applied to the control gate (FIG. 2c) shows that the barrier is removed by the applied voltage, allowing fast and nondestructive removal of negative charge (or equivalently, deposition of positive charge). Analogously, a negative voltage at the control gate removes the barrier by lifting the energy bands from the control-gate side, allowing fast and nondestructive deposition of negative charge. This is the essential difference between the barriers created by a capacitor and a diode that removes the disadvantages of the capacitor-isolated 1T cell. This is the difference that enables the use of nonvolatile 1T memory cells to create dynamic RAM (unlimited number of fast writing cycles).

Figure 3:
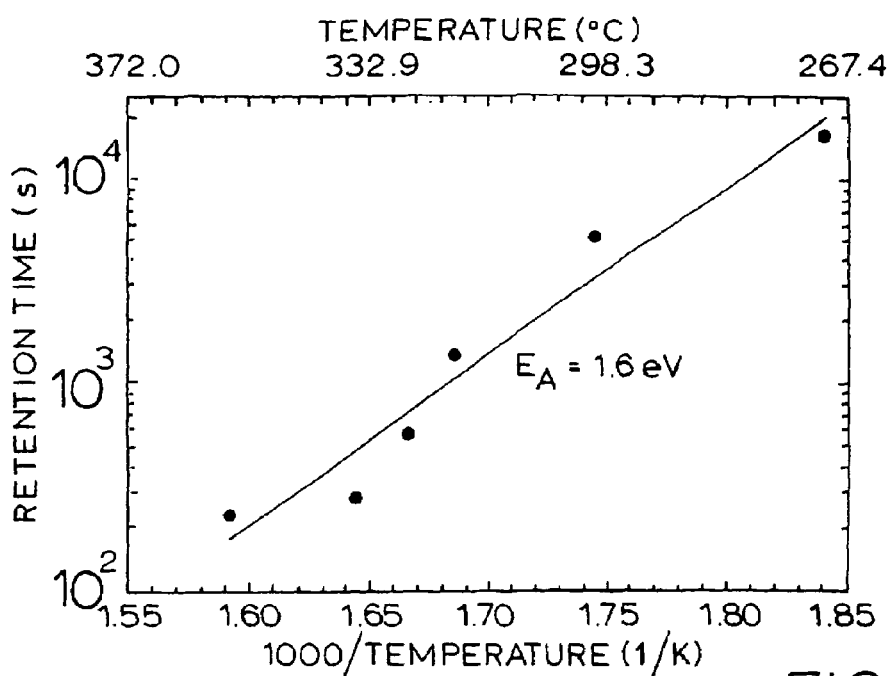
FIG. 3 is Arrhenius plot of charge-retention times measured at different temperatures with a MOS capacitor on 4H SiC.
Figure 4:
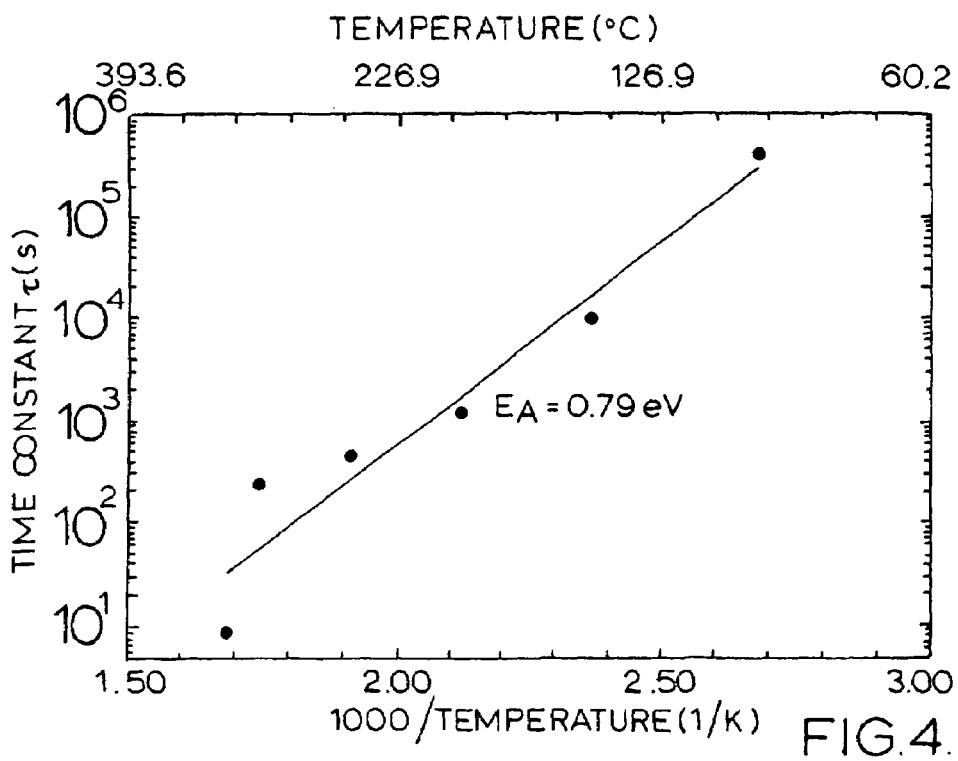
FIG. 4 is Arrhenius plot of charge-retention times measured at different temperatures with a MOS capacitor on 3C SiC.

As mentioned previously, the critical issue with the disclosed 1T cell with diode isolation is not the fast and nondestructive charge deposition and removal but the charge retention. Recently published results (Cheong, Dimitrijev, Han, "Investigation of Electron-Hole Generation in MOS Capacitors on 4H SiC", *IEEE Trans. Electron Devices*, vol. 50, pp. 1433-1439, June 2003) show that surface generation is the dominant leakage mechanisms even in the highest-quality nitrided interfaces on 4H SiC. Therefore, the charge retention in the diode-isolated 1T cell can be characterized by investigating the charge retention in MOS capacitors on SiC. The results of such a study for MOS capacitors on 4H SiC are shown in FIG. 3. As can be seen, the measurements are performed at high temperatures to accelerate the charge generation. The details of the measurement procedure are described elsewhere (e.g. Cheong and Dimitrijev, "MOS Capacitor on 4H—SiC as a Nonvolatile Memory Element", *IEEE Electron Dev. Lett.*, vol. 23, pp. 404-406, July 2002). Assuming Arrhenius type dependence on temperature, the experimental results on charge-retention times at high temperatures can be extrapolated to room temperature. The result that is obtained in this way is $4.6 \times 10^9$ years. Similar study was performed for MOS capacitors on 3C SiC, and the results are shown in FIG. 4. The extrapolation to room temperature gives a charge-retention time of 7.8 years. The energy gap of 3C SiC is narrower, but the difference between the retention times with 4H SiC and 3C SiC is much larger than it should be if the energy gap was the dominant reason. This difference suggests inferior-quality 3C material, which further means that significant improvements in charge retention on 3C SiC are possible with further improvements in the material quality.

As described above the nitrided SiC—$SiO_2$ interfaces provide the maximum retention times with the disclosed 1T cell. However, the disclosed 1T cell with diode isolation is novel and has many useful properties even when implemented without nitrided SiC—$SiO_2$ interfaces, or even with other semiconductors. For example, the charge retention time may drop below a second if the diode is implemented in Si, but the features related to high memory capacity can still be used to create superior volatile DRAMs.

Reading the memory cell is analogous to the capacitor-isolated 1T used in flash memories. The charge in the MOSFET channel depends on the quantity of charge stored in the floating gate. Given that the charge in the channel determines the resistance of the channel, reading is simply performed by applying a voltage across the MOSFET channel and sensing the resulting current.

Figure 5:
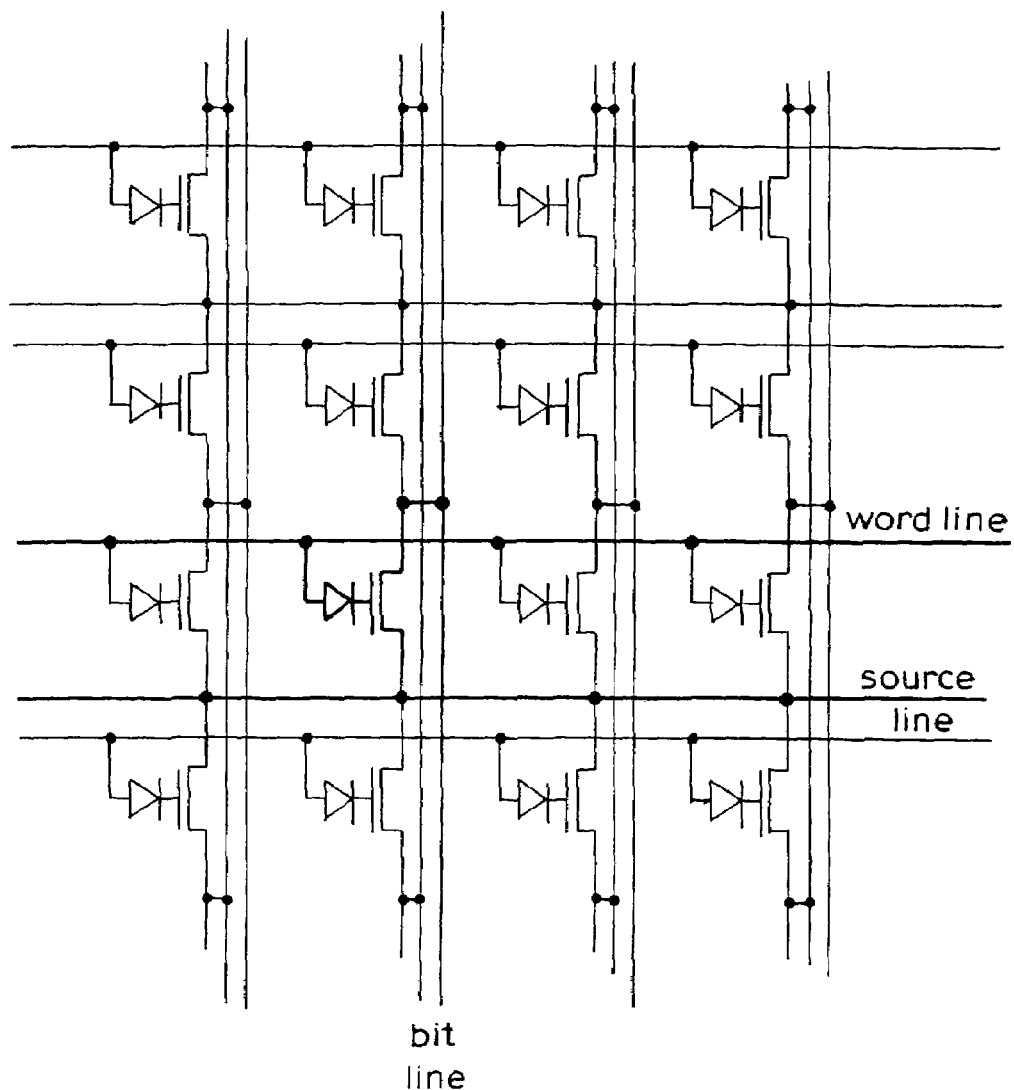
FIG. 5 is NOR memory array using the 1T cells with diode isolation, disclosed in this invention.
Figure 6:
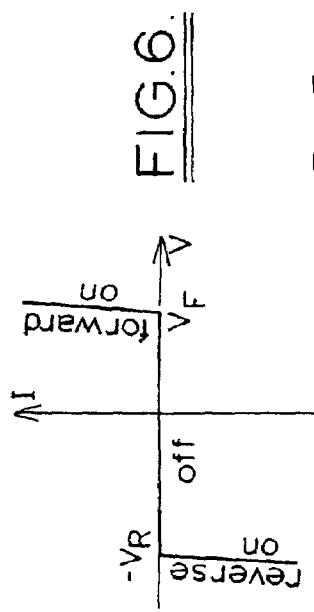
FIG. 6 is I-V characteristic of a reference diode, defining the forward ($V_F$) and the reverse ($V_R$) turn-on voltages.

The gate-isolation diodes enable cell programming without unwanted disturbances of any neighboring cell, even when the cells are used in a NOR-type array (FIG. 5). To deposit positive charge at the gate of a cell, voltage $V_P$ is applied between the corresponding word and bit lines. This voltage has to be larger than the forward turn-on voltage of the diode, $V_F$ (FIG. 6 defines the forward, $V_F$, and the reverse, $V_R$, turn-on voltages of a reference diode). If a part of $V_P$ is set between the word line and ground ($V_W = aV_P$ where a<1) and the other part between the ground and the bit line [$V_B = -(1-a)V_P$], the voltage $V_P$ will appear between the anode and the cathode of the selected diode. This brings this diode into forward on mode and deposits positive charge at the gate that is proportional to $V_P - V_F$. The gates of all the cells along the selected word line will be lifted at $V_W$, however, none of the other bit lines is dropped to $V_B$ as is the case with the selected cell. If $V_P$ is maintained below a maximum limit set by the values of $V_F$ and $V_R$, none of the neighboring diodes will be brought into either forward or reverse on mode. Similarly, the drains of all the cells along the selected bit lines are dropped to $V_B<0$, but the gates of nonselected cells are not lifted to $V_P$, so none of the neighboring cells will be brought into either forward or reverse on mode.

Importantly, $V_P$ can be adjusted between its minimum and maximum values to deposit different quantities of positive charge at the gate. This provides a simple mechanism for setting different logic levels at the cell.

Once the gate is charged, the word line is dropped to $V_W=0V$ to lock the positive charge at gate by the reverse-biased diode. The bit line is also brought to $V_B=0V$ to complete the writing cycle.

To prepare the cell for writing, the deposited charge can be removed by setting the diode in reverse on mode in analogous way. In this case negative $V_N$ voltage is used in place of $V_P$ to cause voltage drop between the cathode and the anode that is larger than $V_R$ while not disturbing any neighboring cells.

Figure 7:
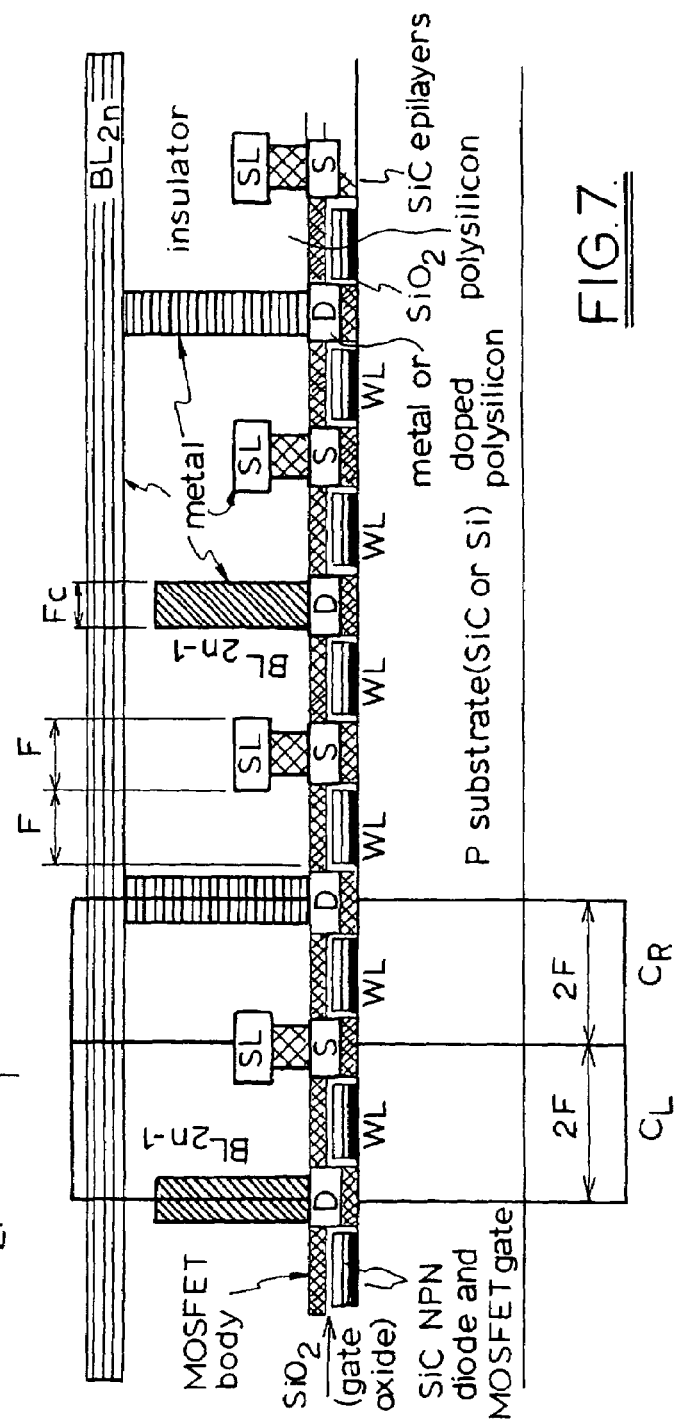
FIG. 7 is cross-sectional view of 1T cells with diode isolation in the preferred implementation.

There are many possible implementations of the diode and the transistor in this cell. FIG. 7 shows the cross-section of memory cells in the preferred implementation. It can be seen that the diodes are at the bottom (on the SiC or Si substrate) whereas the transistors are built on the top of the diodes and appear top-side down given that the gate is below the body of the transistors. This enables simple fabrication of diodes in epitaxial layers of monocrystalline SiC. As far as the body of the transistors is concerned, it can be created in a polysilicon film deposited on the oxide surrounding the diodes by techniques that are well established in silicon technology. The resistance of the polysilicon film is influenced by the charge at the floating gate through the field effect associated with this structure. Either depletion-type or inversion-type field effect can be used. To sense the resistance, self aligned contacts are created to contact the transistor body as source and drain do in the ordinary MOSFET structure. This structure can be described as charge-controlled polysilicon resistor with metal (or polysilicon) contacts. Although this may be a clearer description, electrically, this structure performs the role of a MOSFET.

The structure shown in FIG. 7 shows NPN type of reference diodes and MOSFETs with P-type bodies to match the electrical diagram in FIG. 5. Other combinations are also possible, such as PNP type of reference diode and MOSFETs with either P-type or N-type body. Both the diodes and the MOSFETs can also be implemented in many other ways. For example, the diode implementations may include Schottky contacts and may utilize avalanche generation in the reverse on mode.

The starting material for the structure shown in FIG. 7 is SiC or Si substrate with three SiC epitaxial layers (NPN) on the top. The SiC substrate may be a SiC wafer, in which case the superior temperature conductivity of SiC is utilized for a very efficient heat removal, This alleviates the power dissipation limit, which otherwise can become a limiting factor for the increase in memory capacity. A combination of established processing steps can be used to fabricate this structure. The diodes are created by etching of SiC epilayers, where the bottom N-epitaxial layer is used to create the word lines. The gate oxide is created by oxidation of SiC, the SiC—$SiO_2$ interface being nitrided to maximize the retention time. The body of the MOSFETs is created by polysilicon deposition, doping and etching. The contacts to the body (sources and drains) are created by metal or polysilicon deposition and etching or chemical and mechanical polishing (CMP). The source lines and the bit lines are created by standard techniques: oxide deposition, contact hole opening and filling, standard CMP, and metal deposition and etching.

Figure 8:
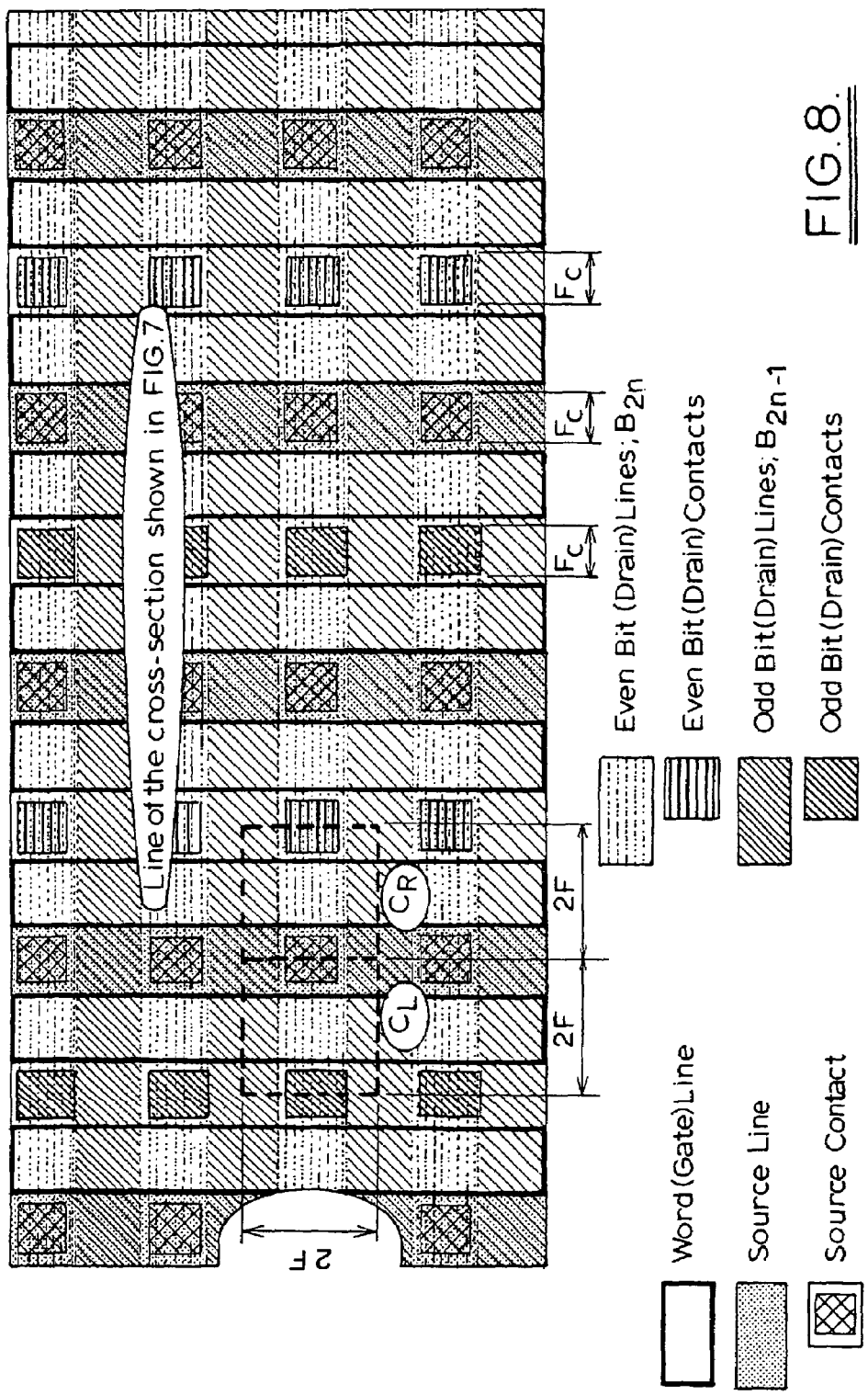
FIG. 8 is the layout of 1T cells used in a NOR-type array.

FIG. 8 illustrates the layout of 1T cells used in a NOR-type array. As the figure shows, the bit lines (drains of MOSFETs) cross the word lines (gates of the MOSFETs). The sources of the MOSFETs run in parallel with the word lines (gates of the MOSFETs). This corresponds to a cell area of $4F^2$.

1T Cell Without Gate Isolation 1T cell without any gate isolation was used in a NOR-type array by S. Okhonin, M. Nagoga, J. M. Sallese and P Fazan (IEEE Electron Device letters Vol 23 No 2 February 2002) to create silicon-based volatile DRAM with increased memory capacity. Implementation of the 1T cell without gate isolation in SiC with passivated surface creates a nonvolatile cell that constitutes an embodiment of this invention.

The memory cell in this embodiment stores minority carriers in the MOSFET channel (electrons in the case of N-channel MOSFET on P-type substrate). Given that the memory MOSFETs share a common substrate and that all the MOSFETs along a word line will have connected gates, it is preferable to select the gate material so that the surface is not inverted at $V_G=0V$. In other words, it is preferable to select the gate material so that the flat-band voltage ($V_{FB}$) is negative for an N-channel MOSFET.

To reduce the surface generation/recombination rate, the gate leakage, and the minimum feature (F), the preferred implementation of the MOSFET in this embodiment is as a self-aligned structure (self-aligned gate and source/drain regions). Self-aligned MOSFETs have been made in silicon (either with polysilicon or metal gates). The challenge in SiC is due to the need for high-temperature annealing to activate the doping of the drain and the source areas after creating them by ion implantation with the MOSFET gates as self-aligning masks. The ion implantation can be performed at room temperature, but this requires prohibitively high annealing temperatures (>1400° C.). An alternative method is to perform the ion-implantation at high temperatures (about 800° C.), in which case the post implant annealing temperature up to 1300° C. is sufficient. Gate materials that satisfy this criterion include polysilicon, molybdenum, and platinum silicides. The SiC film that is needed can be deposited on Si to allow an integration with today's Si electronics.

Figure 9:
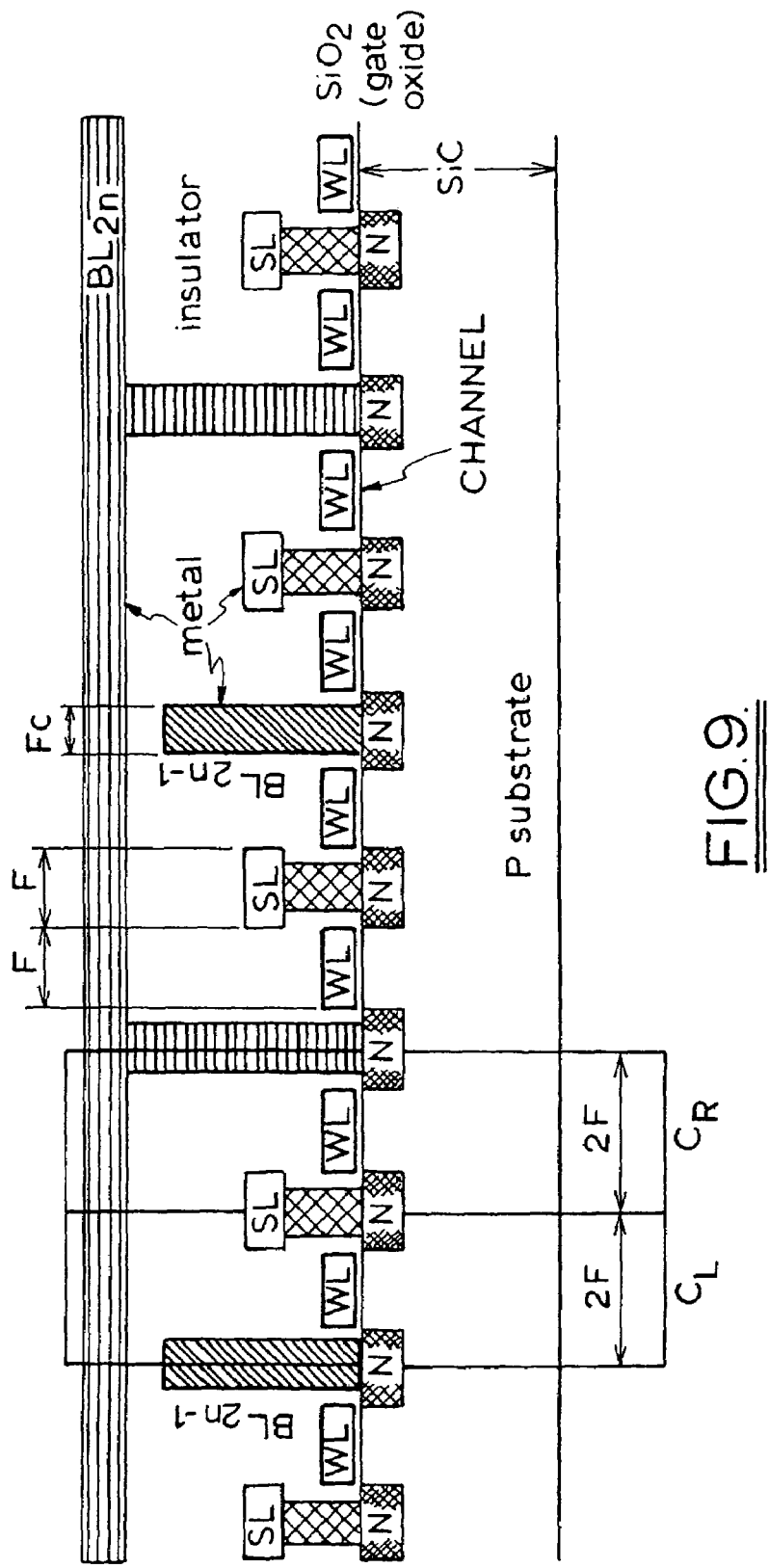
FIG. 9 is cross sectional view of 1T cells without gate isolation in a NOR-type array.

FIG. 9 shows a cross-sectional view of 1T cells without gate isolation in a NOR-type array. For the case of N-channel MOSFETs, a specific suggestion is to select the gate material so that the flat-band voltage $V_{FB}<0$ and the threshold voltage $V_T>0$. With this, the channel area is depleted for $V_G=0$. Some positive charge exists in the gate to compensate the negative acceptor ions in the depleted SiC surface, but this equilibrium charge will be neglected in the following considerations (for clarity). Note that fully analogous descriptions are valid if P-channel MOSFET is used.

Figure 10:
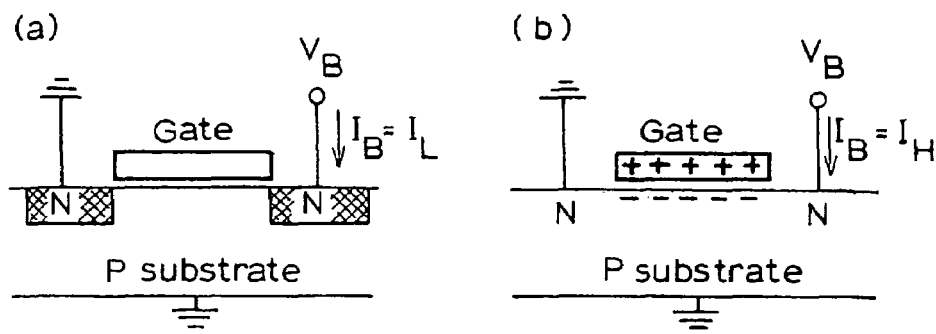
FIG. 10 illustrates the reading states of 1T cell without gate isolation.

Information Reading: The equilibrium state (depleted surface) corresponds to a very high channel resistance and is defined as logic '0' (FIG. 10a). The reading of this state is achieved by connecting the source line to ground and the bit line to a small positive voltage ($V_B$). The channel-resistance at the cross between the source and the bit lines determines the current, and if this MOSFET has a depleted channel, there is no current (logic '0').

The logic '1' state is achieved by trapping extra positive charge on the MOSFET gate to increase the potential in the channel sufficiently so that the inversion layer of electrons is formed at the SiC surface (FIG. 10b). Reading is the same, with a difference that the response is a significant current through the channel (logic '1'). Note that the application of voltage to the drains and the grounding of the sources does not affect the stored information. There will be a small alteration of the surface potential, but the charge on the gate will not change, so the surface SiC condition will be restored after the reading cycle.

Storage Time. The logic '1' state is nonequilibrium, so the natural mechanisms will act to remove the inversion-layer electrons to bring the structure into equilibrium. There are two possible mechanisms of electron removal: (1) leakage through the gate oxide (gate dielectric), and (2) leakage through the switch in the connecting circuit. A high-quality oxide-SiC interface can be achieved to reduce the leakage to sufficient levels. Earlier discussed experimental results indicate that sufficiently low bulk and surface-recombination levels are possible to achieve a practically nonleaky switch (implemented as a SiC MOSFET).

Connecting the Floating Gate for Writing Operations. Writing operations (for both, logic '1' and logic '0') are performed with grounded gates. In this embodiment, the gates are electrically disconnected from ground, by using a SiC MOSFET as a switch, to enable straightforward selection of a cell for information reading and writing. It has been already described that the trapped charge on the gate restores the state of the cell after the disturbance caused by the $V_B$ potential used for information reading. Likewise, the state of a cell is not altered when a bit line (MOSFET drains) is connected to a potential for the purpose of information writing, as will be described in the following text.

Figure 11:
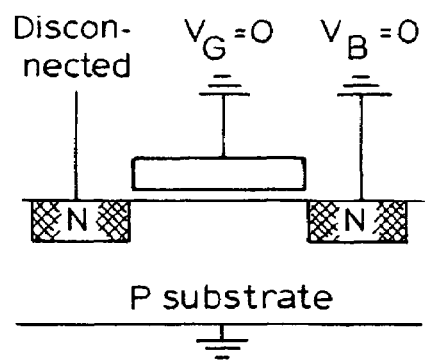
FIG. 11 illustrates the writing of logic 0 in 1T cells without gate isolation.
Figure 12:
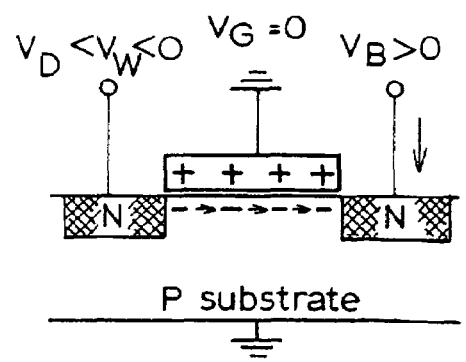
FIG. 12 illustrates the writing of logic 1 in 1T cells without gate isolation.

Writing Logic '0'. Logic '0' corresponds to the equilibrium state (depleted surface). To set this state, a selected word line is grounded (FIG. 11). Importantly, this does not change the state of any of the connected MOSFETs that may be in logic '1' state, as the logic '1' states were also written with the gates grounded. After this, the corresponding bit line is grounded, closing a ground-to-ground circuit through the gate-channel capacitance of the MOSFET in the cross between the word and the gate lines. This removes the electrons from the channel.

Writing Logic '1'. Again, a selected word line is grounded first. In this case, however, the source line along the selected word line is not left disconnected, but is connected to a negative voltage that is just smaller than the forward-bias voltage of the substrate-source P—N junction. This leads to a small increase in the density of holes in the gate, but there should be no injection of electrons by the source, so that the original state-of the depleted surface is restored in the logic '0' MOSFETs that are not selected by the bit line (drains disconnected). Explained in another way, the negative threshold-voltage shift due to the source-to-substrate bias ("inverted body effect") should be limited so that the threshold voltage remains positive and no electrons are induced in the channel. A sufficiently large positive voltage is applied to the selected bit line (MOSFET drains) so that source-substrate N—P junction of the selected MOSFET is set in forward-bias mode and a current of electrons flows through the channel. Note that the existence of electrons in the channel means that the threshold voltage is shifted to a negative value by the drain bias. As the channel electrons induce positive charge in the gate (FIG. 5), the gate is disconnected to trap the positive charge. A simpler procedure for writing the logic '1' state is possible if the inverted body effect in a given MOSFET is strong enough to shift the threshold voltage from positive to negative values by itself. In that case, the drain-to-gate circuit has to be used for writing, given that the drain and gate lines cross each other enabling the selection of a single MOSFET. Therefore, after the gate is grounded, a sufficiently large negative drain voltage is applied to shift the threshold voltage to negative values (again, the drain voltage should not be larger than the turn-on voltage of the drain-to-substrate diode). Given that the gate-to-substrate voltage is zero, the channel of electrons is formed, increasing the gate capacitance to its inversion level and increasing the positive charge in the gate.

N-Channel Inversion Type Self-aligned MOSFET Fabrication Steps:

The following describe in detail the fabrication processes for n-channel inversion type self-aligned MOSFET.

Figure 13:
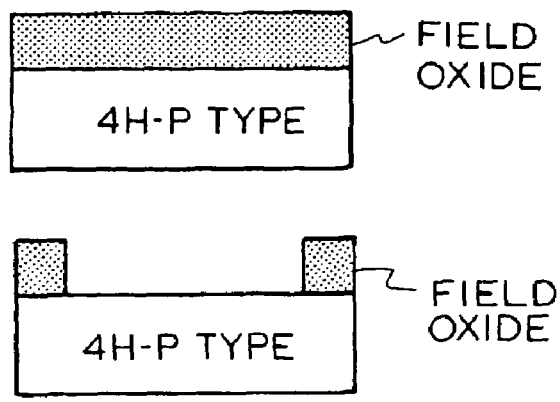
FIG. 13 illustrates step 1 of a fabrication method applicable to this invention.
Figure 14:
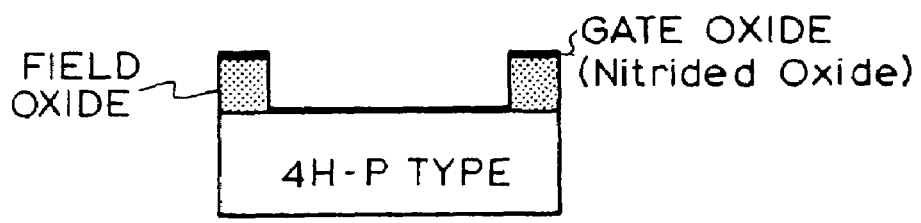
FIG. 14 illustrates step 2 of a fabrication method applicable to this invention.
Figure 15:
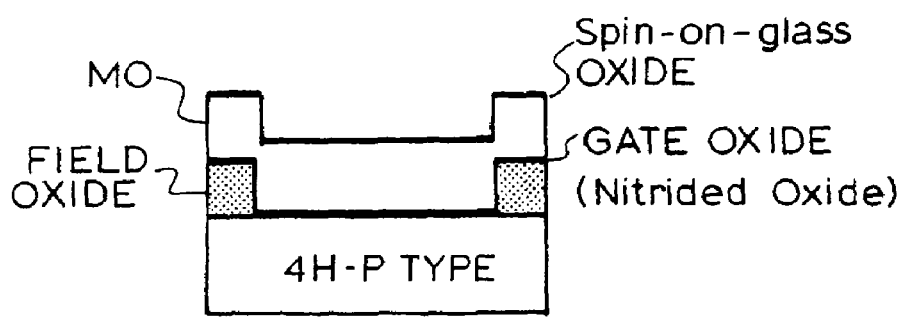
FIG. 15 illustrates step 3 of a fabrication method applicable to this invention.
Figure 16:
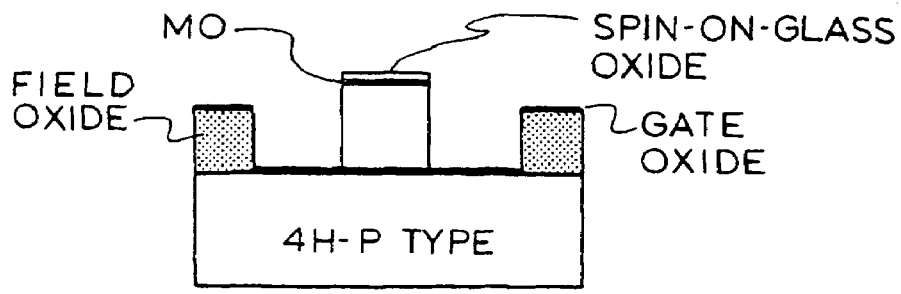
FIG. 16 illustrates step 4 of a fabrication method applicable to this invention.
Figure 17:
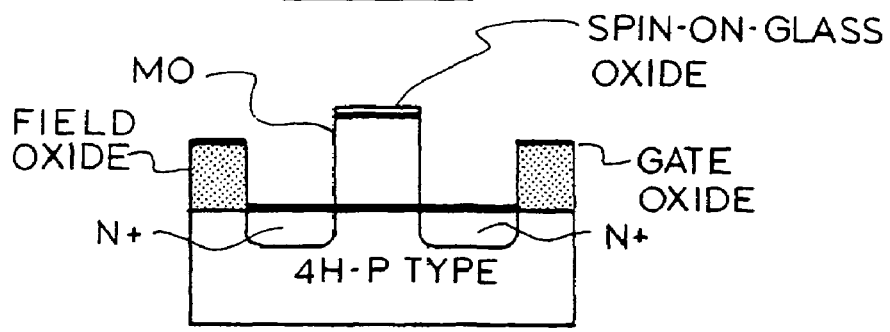
FIG. 17 illustrates step 5 of a fabrication method applicable to this invention.
Figure 18:
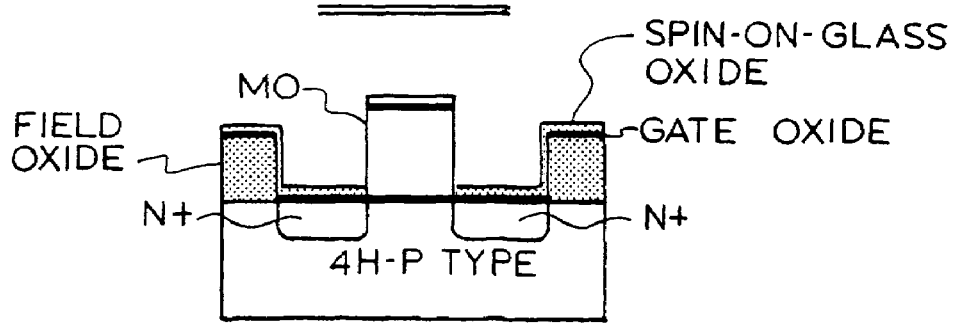
FIG. 18 illustrates step 6 of a fabrication method applicable to this invention.
Figure 19:
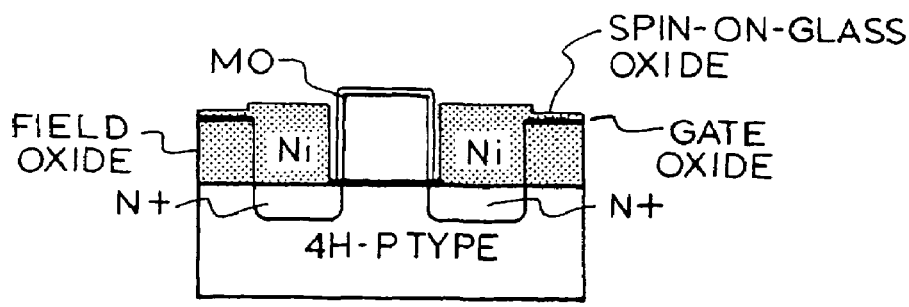
FIG. 19 illustrates step 8 of a fabrication method applicable to this invention.

1] Define Active Region: See FIG. 13
  1.1. Clean wafer
  1.2. Sputtered 500-nm thick field oxide—SiO$_2$ [3 hrs=1.1 um]
  1.3. Deposit photoresist & soft bake
  1.4. Expose UV (mask 1)
  1.5. Develop photoresist & hard bake
  1.6. Etch field oxide with BHF
  1.7. Remove photoresist by ethanol
2] Grown Gate Oxide: see FIG. 14
  2.1. Clean wafer (without HF)***
  2.2. Thermally grown 50 nm gate oxide (nitrided oxide) [1 hr NO, 4 hr O$_2$, 2 hr NO, and cool down overnight]
3] Formation of Metal Contact Layer for Gate Oxide: see FIG. 15
  3.1. Sputtered 1-μm thick MO [200 W for 55 min]
  3.2. Deposit 200 nm SiO$_2$ by spin-on-glass (sog) [4000 rpm]
  3.3. Soft bake @ 200° C. for 1 hr
  3.4. Hard bake @ 900° C. for 20 min.
  3.5. Cool down to 700° C.
  3.6. Deposit photoresist & soft bake
  3.7. Expose UV (mask 2)
  3.8. Develop photoresist & hard bake
  3.9. Etch SiO$_2$ (spin-on-glass) with BHF
  3.10. Etch Mo [1 min 15 s can etch 1-μm thick Mo ]
4] Ion Implantation (N$^+$): See FIG. 16
5] Activate & Drive-in implanted ion: See FIG. 17
  5.1. Annealing at 950° C. (or 1300° C.) for 30 min
6] Open Source/Drain Windows: See FIG. 18
  6.1. Spin-on-glas, SiO$_{2(Mo)}$ (to protect Mo sidewall from Ni etchant)
  6.2. Deposit photoresist & soft bake
  6.3. Expose UV (mask 3)
  6.4. Develop photoresist & hard bake
  6.5. Etch SiO$_2$ (SiO$_{2(Mo)}$, spin-on-glass on MOS-C, MOSFET, and R$_c$ test structure & nitrided oxide on R$_c$ test structure) with BHF
  6.6. Remove photoresist by etanol
7] Prepare Bulk Contact Area:
  7.1. Deposit photoresist & soft bake
  7.2. Expose UV (mask 4)
  7.3. Develop photoresist & hard bake
  7.4. Etch Mo
  7.5. Etch nitrided oxide
8] Metallization of Source/Drain/Bulk Contact: See FIG. 19
  8.1. Sputtered 500 nm Ni (time=40 min @ 200° C.)
  8.2. Deposit photoresist & soft bake
  8.3. Expose UV (mask 5)
  8.4. Develop photoresist & hard bake
  8.5. Remove photoresist In summary, the present invention exploits low bulk and surface recombination rates that can be achieved in SiC.

This fact is utilized to propose a nonvolatile dynamic random-access memory (DRAM) with the following features:
1. Practically indefinite information storage, even when no power is connected to the cell (memory).
2. Fast reading and writing—comparable to today's DRAMs on silicon that need refreshing (volatile DRAMs).
3. Indefinite number of writing cycles.
4. A smaller cell size than today's commercial volatile DRAMs—$4F^2$, where F is the minimum feature size.
5. Easier downscaling of F compared to today's volatile DRAMs. This is mainly due to the fact that the '0' and '1' logic levels are implemented as two states of a channel resistance, so the difference between the two levels does not critically depend on how small F is. As opposed to this, a relatively small difference in two capacitance levels is used in today's volatile DRAMs, so that downscaling of the memory capacitor is already a limiting factor.
6. Reduced power dissipation.
7. Multiple logic levels and therefore higher memory capacities.
8. Full compatibility with silicon enable support electronics to be produced in this more mature material.
9. The higher thermal conductivity will also enable higher mass storage of digital information.

Those skilled in the art will realize that the invention can be implemented in a variety of ways in a number of configurations without departing from the critical teaching of this invention.

The invention claimed is:

1. Dynamic Nonvolatile Random Access Memory for storing information, comprising a one-transistor cell having a control gate, a floating gate and source and drain terminals wherein a silicon carbide device is disposed between the control gate and the floating gate and information is read by sensing resistance between the source and drain terminals of the transistor.

2. Dynamic Nonvolatile Random Access Memory as claimed in claim 1 in which the silicon carbide device is an isolation diode.

3. Dynamic Nonvolatile Random Access Memory as claimed in claim 2 in which the silicon carbide is a 3C SiC wafer.

4. Dynamic Nonvolatile Random Access Memory as claimed in claim 2 in which said isolation diode is implemented in silicon carbide with $SiO_2$ as the insulator and the SiC—$SiO_2$ interface is passivated to create charge retention times sufficiently long to avoid the need for the one transistor memory cell to be electrically refreshed.

5. Dynamic Nonvolatile Random Access Memory as claimed in claim 4 in which the charge retention times are greater than 7 years.

6. Dynamic Nonvolatile RAM as claimed in claim 4 in which the SiC—$SiO_2$ interface is nitrided in either NO or $N_2O$ rich environments.

7. Dynamic Nonvolatile RAM as claimed in claim 4 in which the SiC—$SiO_2$ interface is prepared by direct oxide growth or by annealing of pre-grown oxide on the SiC layer in the presence of NO or $N_2O$.

8. Dynamic Nonvolatile RAM as claimed in claim 7 which includes the step of forming a nitrided silicon oxide gate on the silicon carbide substrate and subsequently carrying out ion implantation.

9. The dynamic NVRAM as claimed in claim 2 wherein the isolating diode is a reference-type diode with both forward and reverse on operation when the forward and reverse turn-on voltages are exceeded.

10. A one transistor cell for use as a memory device for storing information, said cell having a control gate, a floating gate and source and drain terminals wherein a silicon carbide device is disposed between the control gate and the floating gate and information is read by sensing resistance between the source and drain terminals of the transistor.

11. A one transistor cell as claimed in claim 10 in which the silicon carbide device is an isolation diode.

12. A one transistor cell as claimed in claim 11 in which the isolation diode is created from N-type and P-type semiconductors forming either NPN or PNP structures.

13. A one transistor cell as claimed in claim 10 in which the silicon carbide device includes $SiO_2$ as an insulator and a resulting SiC—$SiO_2$ interface is passivated to create charge retention times sufficiently long to avoid the need for the one transistor memory cell to be electrically refreshed.

14. A one transistor cell as claimed in claim 2 in which the SiC—$SiO_2$ interface is nitrided in either NO or $N_2O$ rich environments.

15. A one transistor cell as claimed in claim 13 in which the SiC—$SiO_2$ interface is prepared by direct oxide growth or by annealing of pre-grown oxide on the SiC layer in the presence of NO or $N_2O$.

16. A one transistor cell as claimed in claim 13 in which source and drain contacts are used to sense resistance and the resistance depends on the electric field formed by the nonequilibrium charge stored at the floating gate.

17. A one transistor cell as claimed in claim 16 in which metal or heavily-doped polysilicon are used for the drain and source contacts.

18. A random-access memory array in which memory cells as claimed in claim 10 are connected by word lines connecting control gates, the word lines are in parallel with source lines connecting the source contacts, and the word and source lines are crossing bit lines that connect the drain contacts.

* * * * *